(12) United States Patent
Nishikawa et al.

(10) Patent No.: US 9,281,498 B2
(45) Date of Patent: Mar. 8, 2016

(54) ORGANIC EL DEVICE

(75) Inventors: Akira Nishikawa, Kamikita-gun (JP); Shigeru Ayukawa, Tokyo (JP); Hideo Yamagishi, Kamikita-gun (JP)

(73) Assignee: KANEKA CORPORATION, Osaka-shi (JP)

( * ) Notice: Subject to any disclaimer, the term of this patent is extended or adjusted under 35 U.S.C. 154(b) by 252 days.

(21) Appl. No.: 13/990,392

(22) PCT Filed: Nov. 7, 2011

(86) PCT No.: PCT/JP2011/075552
§ 371 (c)(1),
(2), (4) Date: May 29, 2013

(87) PCT Pub. No.: WO2012/073650
PCT Pub. Date: Jun. 7, 2012

(65) Prior Publication Data
US 2013/0249390 A1    Sep. 26, 2013

(30) Foreign Application Priority Data

Nov. 30, 2010 (JP) ................................ 2010-266271

(51) Int. Cl.
*H05B 33/04* (2006.01)
*H01L 51/52* (2006.01)
(Continued)

(52) U.S. Cl.
CPC ........ *H01L 51/5253* (2013.01); *H01L 51/5203* (2013.01); *H01L 51/524* (2013.01); *H01L 51/5246* (2013.01); *H05B 33/04* (2013.01); *H05B 33/10* (2013.01); *H01L 27/3204* (2013.01)

(58) Field of Classification Search
CPC ............ G02B 19/0071; H01L 27/3204; H01L 51/524; H01L 51/5246

USPC ......................................................... 362/555
See application file for complete search history.

(56) References Cited

U.S. PATENT DOCUMENTS 7,635,954 B2 * 12/2009 Niedermeier .................. 315/122
2005/0272263 A1 * 12/2005 Brabec et al. .................. 438/689
(Continued)

FOREIGN PATENT DOCUMENTS

CN          1469689 A     1/2004
CN        101287314 A    10/2008
(Continued)

OTHER PUBLICATIONS

International Bureau of WIPO, International Preliminary Report on Patentability of PCT/JP2011/075552, Switzerland, Jun. 13, 2013, 7 pages.

(Continued)

*Primary Examiner* — Nimeshkumar Patel
*Assistant Examiner* — Jacob R Stern
(74) *Attorney, Agent, or Firm* — Alleman Hall McCoy Russell & Tuttle LLP

(57) ABSTRACT

An organic EL device that efficiently extracts light includes an organic EL element formed by laminating a first electrode layer, functional layer, and second electrode layer on a substrate and a sealing member sealing the organic EL element. The organic EL device has a first electrode communicating part electrically connected to the first electrode layer at one side of the substrate and a second electrode communicating part electrically connected to the second electrode layer at the other side of the substrate. The organic EL device has first cross grooves crossing the organic EL element from the second electrode layer located at the one side to the second electrode layer that is located at the other side. The first cross groove is formed by removing the first electrode layer, functional layer, and second electrode layer. The sealing member and the substrate are connected outside of the first cross grooves.

14 Claims, 12 Drawing Sheets

(51) Int. Cl.
   *H05B 33/10*   (2006.01)
   *H01L 27/32*   (2006.01)

(56) References Cited

U.S. PATENT DOCUMENTS

2007/0172971 A1* 7/2007 Boroson .................. 438/26
2010/0148665 A1* 6/2010 Farquhar et al. ............ 313/512
2011/0198622 A1* 8/2011 Amelung .................. 257/88

FOREIGN PATENT DOCUMENTS

| JP | 2004022291 A | 1/2004 |
| JP | 2008262796 A | 10/2008 |
| WO | 2011024951 A1 | 3/2011 |

OTHER PUBLICATIONS

ISA Japan, International Search Report of PCT/JP2011/075552, Nov. 28, 2011, WIPO, 2 pages.

* cited by examiner

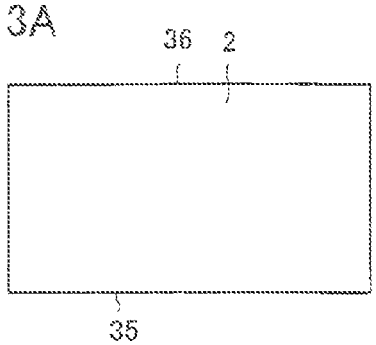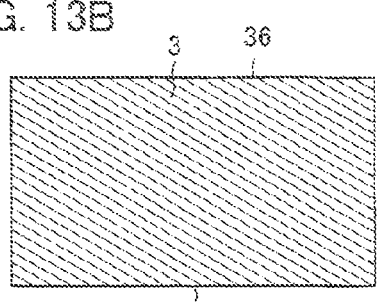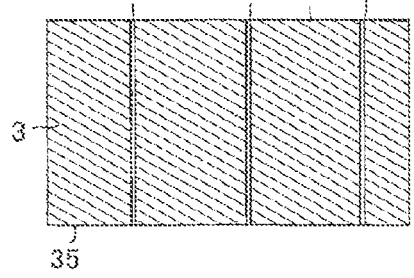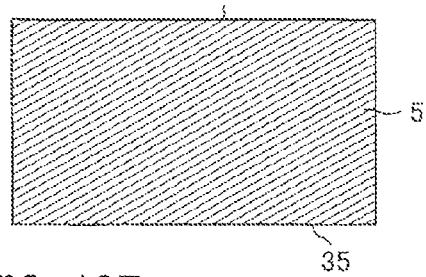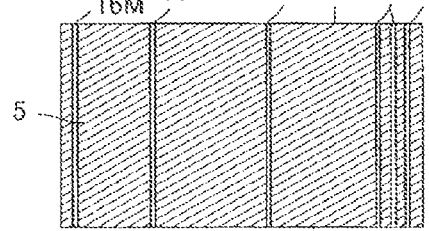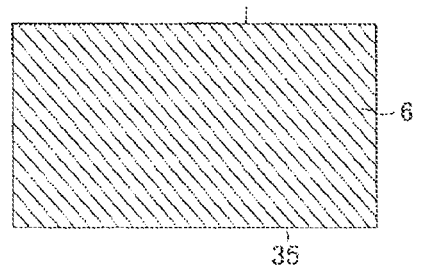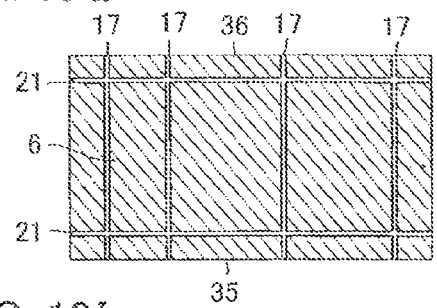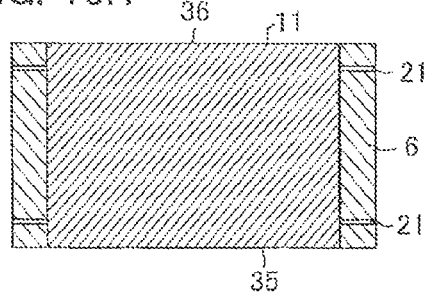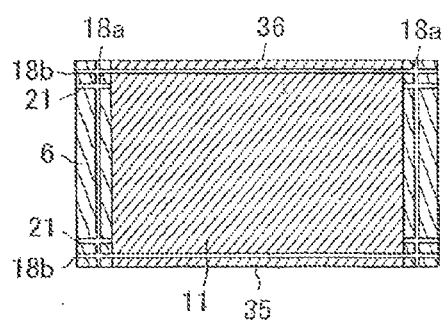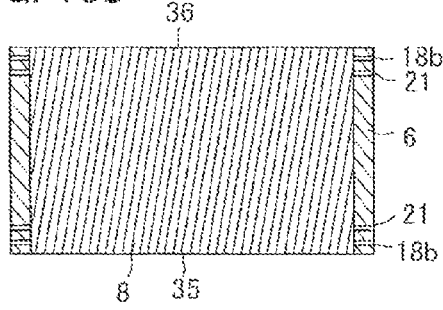

ORGANIC EL DEVICE

TECHNICAL FIELD

The present invention relates to an organic EL (Electro Luminescence) device.

BACKGROUND ART

Recently, organic EL devices are attracting attention and EL lighting devices are replacing incandescent lighting and fluorescent lighting. Further, organic EL systems are gathering attention as an alternative to a liquid crystal system or a plasma system in display components such as televisions.

An organic EL device is formed by laminating organic EL elements on a substrate such as a glass substrate or a transparent resin film. An organic EL element includes two opposed electrodes, at least one of which is translucent, and an emitting layer consisting of organic compounds laminated between the electrodes. The organic EL device emits light by an energy arising from recombination of electrically excited electrons and holes. The organic EL device provides high contrast images when used as a display component because it is a self-luminous device. Further, the organic EL device can emit light of various wavelengths by appropriately selecting materials for an emitting layer. Still further, the organic EL device is substantially thinner than an incandescent light or a fluorescent light and emits light in a planar form, and so has fewer installation restrictions.

The organic EL element may have a problem of marked deterioration in luminescence properties such as light-emitting brightness, luminescence efficiency, and light-emitting uniformity, as compared to an initial state after operation for a certain period of time. Such deterioration in luminescence properties results from electrode oxidation by oxygen that invades into the organic EL element, an oxidative decomposition of organic materials by heat that is generated when the device is operated, an electrode oxidation by moisture in the air that invades into the organic EL element, degeneration of organic compounds, and the like. The deterioration of luminescence properties also results from mechanical deterioration of an interface structure such as debonding caused by oxygen or moisture or by stress generated at the structural interface by different coefficients of thermal expansion in the composite elements, which is triggered by heat generation or high-temperatures during device operation.

In order to prevent the deterioration of the organic EL device, it is necessary to prevent liquid such as moisture or gas such as oxygen from invading into the organic EL element.

A technique to protect the organic EL element from contact with moisture and/or oxygen by sealing the element using a resin adhesive has been proposed so as to prevent such the above-mentioned problem.

The technique to prevent deterioration by moisture and oxygen, for example, includes measures such as covering with a sealing member over an emitting layer formed on a substrate of an organic EL element, sealing it with an adhesive, and filling a hygroscopic adsorbent into the sealed space. (Patent Document 1)

PATENT DOCUMENT

Patent Document 1: JP 2004-235077 A

DISCLOSURE OF INVENTION

Technical Problem

However, sealing using an adhesive in the art may not sufficiently bring about a desired sealing property because a substance such as moisture permeates through a part sealed with the adhesive when the organic EL device is operated for a long period of time. Deterioration of luminescence properties caused by invasion of a substance such as moisture may still occur.

The present invention therefore aims to solve the above-mentioned problems and drawbacks and develop an organic EL device that protects a light emitting part of the organic EL device from invasion of a substance such as moisture.

Solution to Problem

An aspect of the present invention to solve the above-mentioned problems and drawbacks is an organic EL device including a laminated body consisting of a first electrode layer, an organic emitting layer, and a second electrode layer laminated on a substrate and a sealing member sealing the laminated body, the substrate having one side and another side opposite to the one side, the organic EL device having a first electrode communicating part electrically connected to the first electrode layer at the one side of the substrate and a second electrode communicating part electrically connected to the second electrode layer at the other side of the substrate, the organic EL device having a first cross groove (inner cross groove) crossing the laminated body from the first electrode communicating part to the second electrode communicating part, wherein the first cross groove is formed by removing all of the first electrode layer, the organic emitting layer, and the second electrode layer, and wherein the sealing member and the substrate are connected at a connecting part located outside of the first cross groove. Herein, the term "electrically connected" includes not only a direct connection but also an indirect connection.

According to this configuration, because the connecting part of the sealing member and the substrate is located outside of the first cross groove, in a case where a substance such as water might invade into the organic EL device beyond the connecting part, the first cross groove located interiorly of the connecting part prevents the substance such as water from flowing to the light-emitting part of the organic EL device. As a consequence, the organic EL device has a long service life.

The organic EL device of the present aspect preferably has a second cross groove (outer cross groove) located outside of the first cross groove, wherein the second cross groove is formed by removing at least the organic emitting layer and the second electrode layer, and wherein the sealing member is attached to the second cross groove via an adhesive material disposed in the second cross groove.

According to this configuration, the sealing member is attached to the second cross groove via the adhesive material disposed in the second cross groove, which restricts the invasion of liquid such as moisture into the sealing member and better prevents the invasion into the emitting part of the organic EL device.

The organic EL device of the present aspect preferably has a first longitudinal groove formed in a direction perpendicular to the second cross groove, wherein the first longitudinal groove is formed by removing at least the organic emitting layer and the second electrode layer, wherein, in the first longitudinal groove, at least the first electrode layer is laminated, and wherein the sealing member is attached to the first longitudinal groove via an adhesive material disposed in the first longitudinal groove.

It is preferable that the first longitudinal groove and the second cross groove are formed by a laser scribing process, the first longitudinal groove having at least a part of a bottom face composed of the same layer configuration as that of the second cross groove.

Further, in the organic EL device of the present aspect, it is preferable that the first electrode layer, the organic emitting layer, and the second electrode layer have grooves so as to be divided into a plurality of unit EL elements, the unit EL elements being electrically connected in series.

According to this configuration, a plurality of the unit EL elements emit light uniformly.

In the organic EL device of the present aspect, it is preferable that the first electrode layer extends outwardly from the sealing member, the first electrode layer being directly connected to the second electrode layer within the sealing member and being electrically connected to the second electrode communicating part in series outside of the sealing member.

This configuration facilitates electric supply to the organic EL device.

The sealing member is preferably formed by an insulating material.

Further, the sealing member is preferably attached to the laminated body via an insulating adhesive material.

The insulating adhesive material preferably contains a fritted glass as a major ingredient.

The first cross groove is preferably formed by a laser scribing process.

The organic EL device preferably has a non-emitting organic EL element area located outside of the first cross groove, and wherein, in the non-emitting organic EL element area, the first electrode layer, the organic emitting layer, and the second electrode layer are laminated.

The first cross groove preferably has at least a part of a bottom face, on which a protection layer having a gas barrier property and/or a moisture absorption characteristic is laminated.

Advantageous Effect of Invention

According to the configuration relating to the present invention, because the connecting part where the sealing member and the substrate are connected is located outside of the first cross groove, in a case where a substance such as water might invade into the organic EL device beyond the connecting part, the first cross groove located interiorly of the connecting part prevents the substance such as water from flowing to the light emitting part. As a consequence, the organic EL device has a long service life.

BRIEF DESCRIPTION OF DRAWINGS

FIGS. 13A to 13J are explanatory views of a production process of the organic EL device of the first embodiment, FIG. 13A being a view at the beginning of a step of laminating a first electrode layer, FIG. 13B being a view at the beginning of a first laser scribing step, FIG. 13C being a view at the beginning of a step of laminating a functional layer, FIG. 13D being a view at the end of a second laser scribing step, FIG. 13E being a view at the beginning of a step of laminating a second electrode layer, FIG. 13F being a view at the beginning of a third laser scribing step, FIG. 13G being a view at the beginning of a step of laminating a protector, FIG. 13H being a view at the beginning of a fourth laser scribing step, FIG. 13I being a view at the beginning of a sealing step, and FIG. 13J being a view at the end of the sealing step;

DESCRIPTION OF EMBODIMENT

Figure 1:
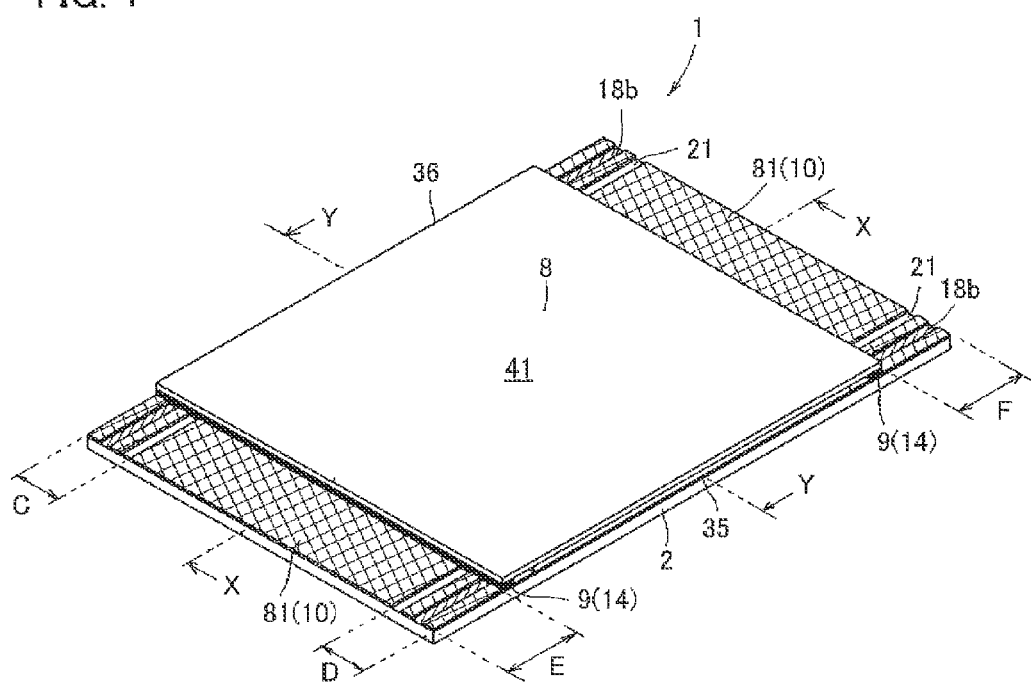
FIG. 1 is a rear perspective view of an organic EL device of a first embodiment of the present invention.

The present invention relates to an organic EL device. FIG. 1 shows an organic EL device 1 of a first embodiment of the present invention. Hereinafter, a positional relationship of the top, bottom, right, and left is described with reference to a position in FIG. 1 unless otherwise specifically noted.

Figure 2:
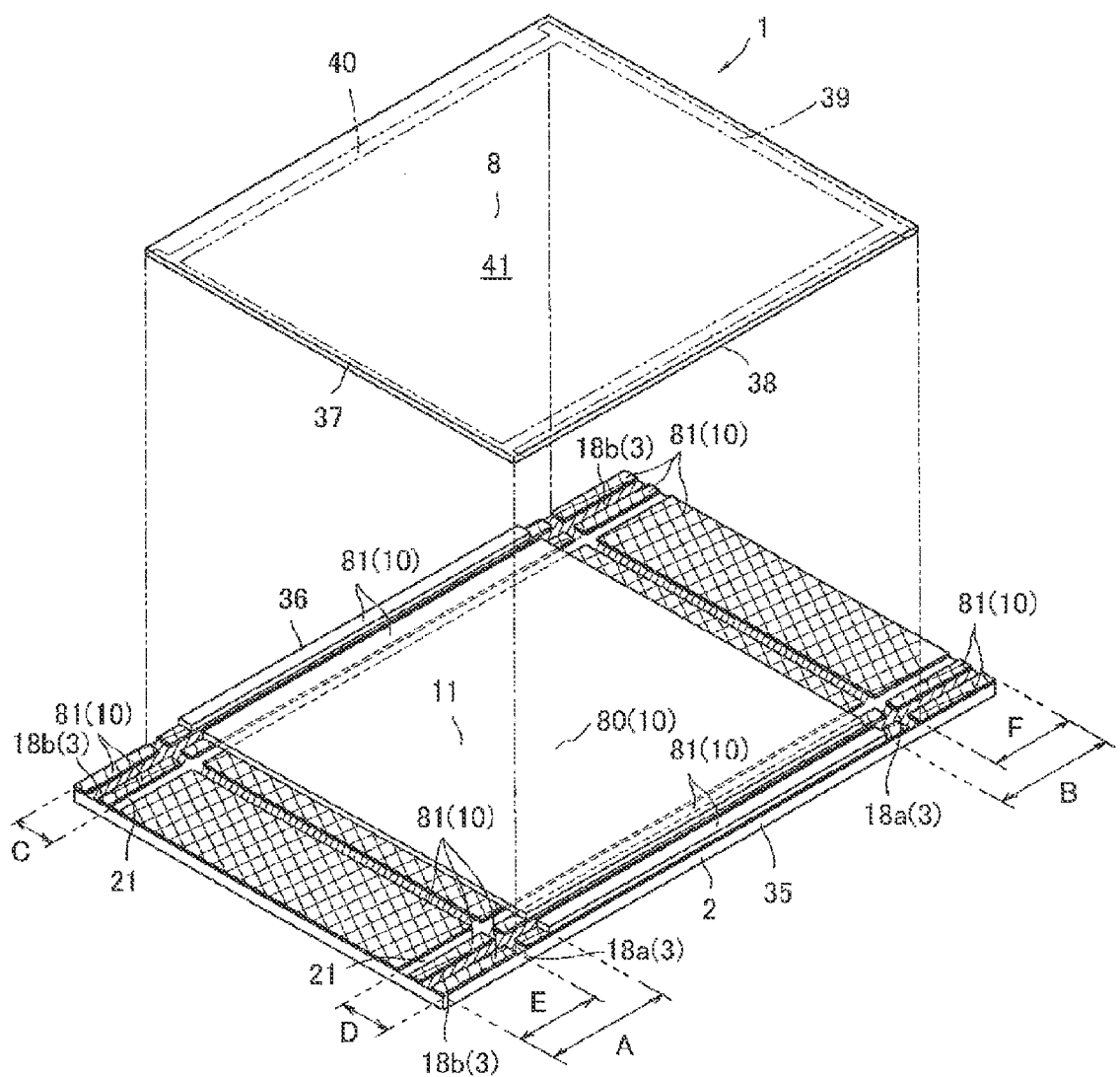
FIG. 2 is an exploded perspective view of the organic EL device in FIG. 1.

The organic EL device 1 of this embodiment is, as well as the known art, provided with a plate-like sealing member 8 arranged at the back (upside in the figure) of a substrate 2 (base material). The sealing member 8 covers an organic EL element part 10 together with a protection layer 11, thereby shielding the organic EL element part 10 from outside (FIGS. 1 and 2).

In this embodiment, the organic EL element part 10 is formed by a lamination of three layers consisting of a first electrode layer 3, a functional layer 5, and a second electrode layer 6. Further, the organic EL element part 10 consists of an emitting organic EL element area 80 and non-emitting organic EL element areas 81. The emitting organic EL element area 80 is the organic EL element part 10 that is designed to actually emit light, while the non-emitting organic EL element areas 81 are the organic EL element parts 10 that are designed not to emit light and are other areas than the emitting organic EL element area 80. The sealing member 8 and the substrate 2 are attached via an insulating adhesive material 9 (connecting part) containing a fritted glass as a major ingredient. Herein, the term "major ingredient" means that a mass percent concentration in proportion to the complete ingredient is 50% or more and 100% or less. Concerning the insulating adhesive material 9, this mass percent concentration of a fritted glass to the complete ingredient is preferably 70% or more, more preferably 80% or more, and particularly preferably 90% or more.

Figure 3:
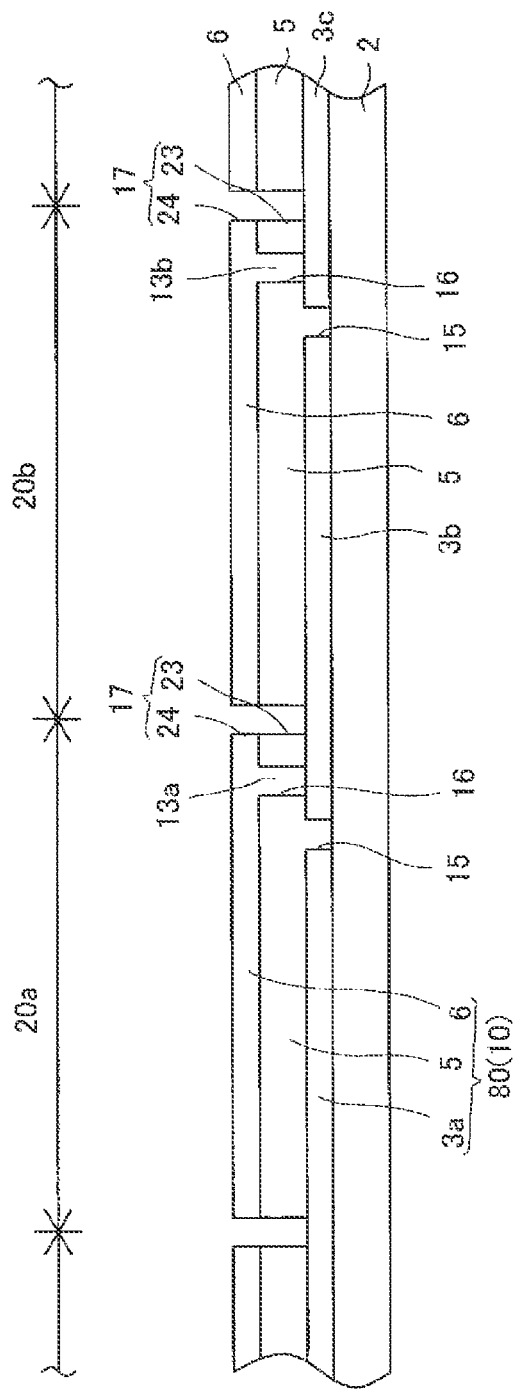
FIG. 3 is a cross section illustrating a layer configuration of an organic EL element part in the organic EL device in FIG. 1.
Figure 4:
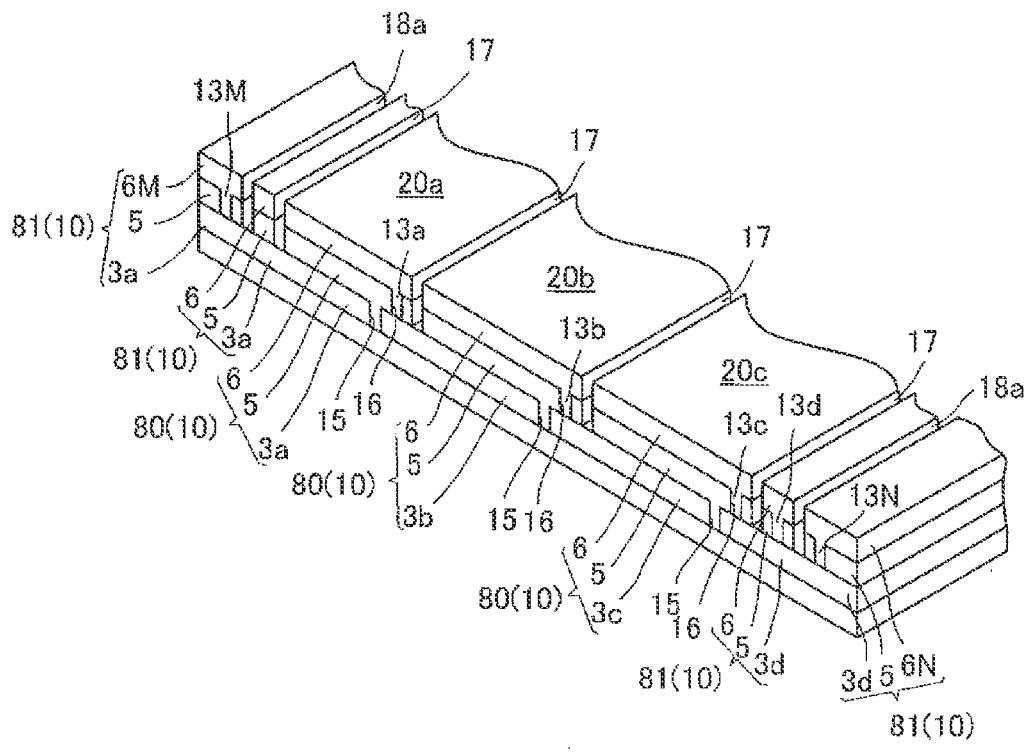
FIG. 4 is a cross-sectional perspective view illustrating the layer configuration of the organic EL element part in the organic EL device in FIG. 1.
Figure 5:
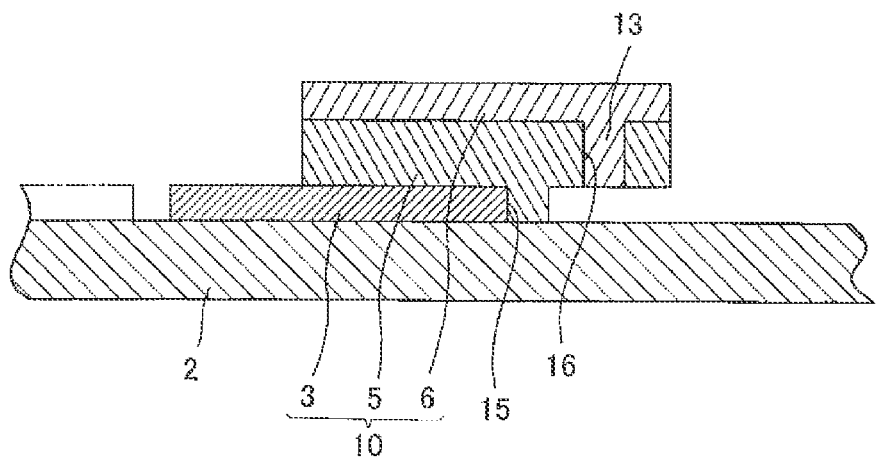
FIG. 5 is a cross section showing a configuration of a unit EL element in the organic EL device in FIG. 1.
Figure 6:
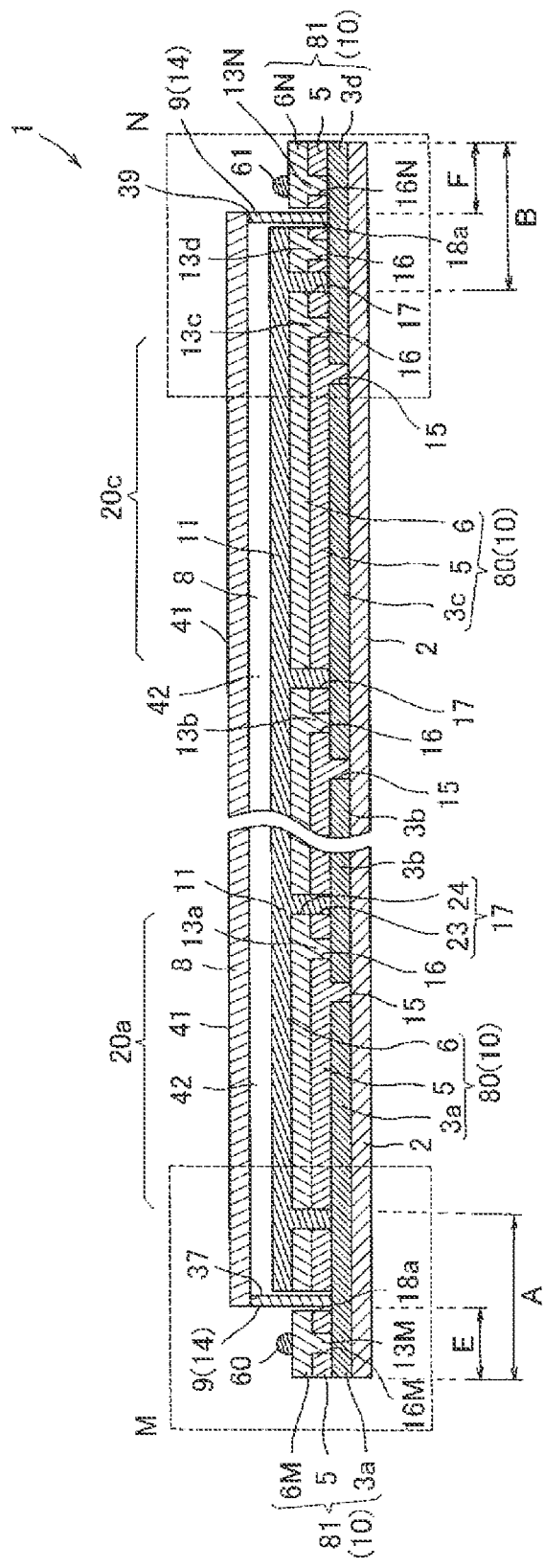
FIG. 6 is a cross section of the organic EL device in FIG. 1 taken in a direction X-X.
Figure 7:
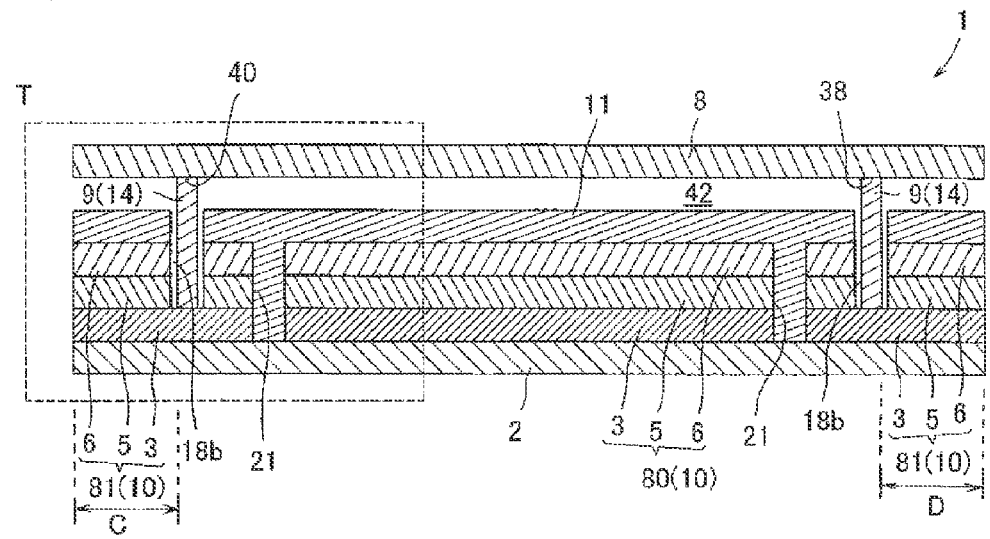
FIG. 7 is a cross section of the organic EL device in FIG. 1 taken in a direction Y-Y.

The organic EL element part (except the protection layer 11) 10 of the organic EL device 1 has a layer configuration, as shown in FIGS. 3, 4, and 5, consisting of the first electrode layer 3, the functional layer 5 (organic emitting layer), and the second electrode layer 6 laminated on the substrate 2 (base material) in this order. The organic EL device 1 of this embodiment is configured in such a manner that the protection layer 11 is further laminated, as shown in FIGS. 6 and 7, on the organic EL element part 10 shown in FIGS. 3, 4, and 5 and further the protection layer 11 and the organic EL element part 10 are sealed by the sealing member 8 via the insulating adhesive material 9.

For convenience of description, a characteristic configuration of this embodiment will be first described below. The organic EL element part 10 will be described in detail later.

Referring to FIG. 2, in the organic EL device 1 of this embodiment, the substrate 2 is of a rectangular shape and the organic EL element part 10 is deposited thereon. The emitting organic EL element area 80 (including the protection layer 11) that is designed to actually emit light is arranged in a central part of the substrate 2. In other words, the first electrode layer 3, the functional layer 5 (organic emitting layer), and the second electrode layer 6 are deposited on the substrate 2 and the protection layer 11 is further laminated thereon in the central part of the substrate 2.

In the organic EL device 1 of this embodiment, as shown in FIG. 2, the organic EL element part 10 is deposited on a substantially entire area of the substrate 2 and partly removed so as to form grooves. Specifically, in the organic EL device 1 of this embodiment, the organic EL element part 10 (emitting organic EL element area 80) that is designed to actually emit light lies only in the central part of the substrate 2. More specifically, the organic EL device 1 has at both ends in its longitudinal direction non-emitting excluded regions A and B (non-emitting organic EL element areas 81) that are excluded from the emitting organic EL element area 80. The organic EL element part 10 lies on the substrate 2 except at the grooves in its short direction. Therefore, a mask process to cover an undeposited surface that is not to be deposited is eliminated when the organic EL element part 10 is deposited by a laser scribing process. The excluded regions A and B each have a separation groove 18a for fixing a frit, which is formed by removing at least any layer located above the first electrode layer 3.

Hence, immediately after formation of the separation groove 18a for fixing a frit, the first electrode layer 3 is exposed at a bottom of the separation groove 18a.

Figure 8:
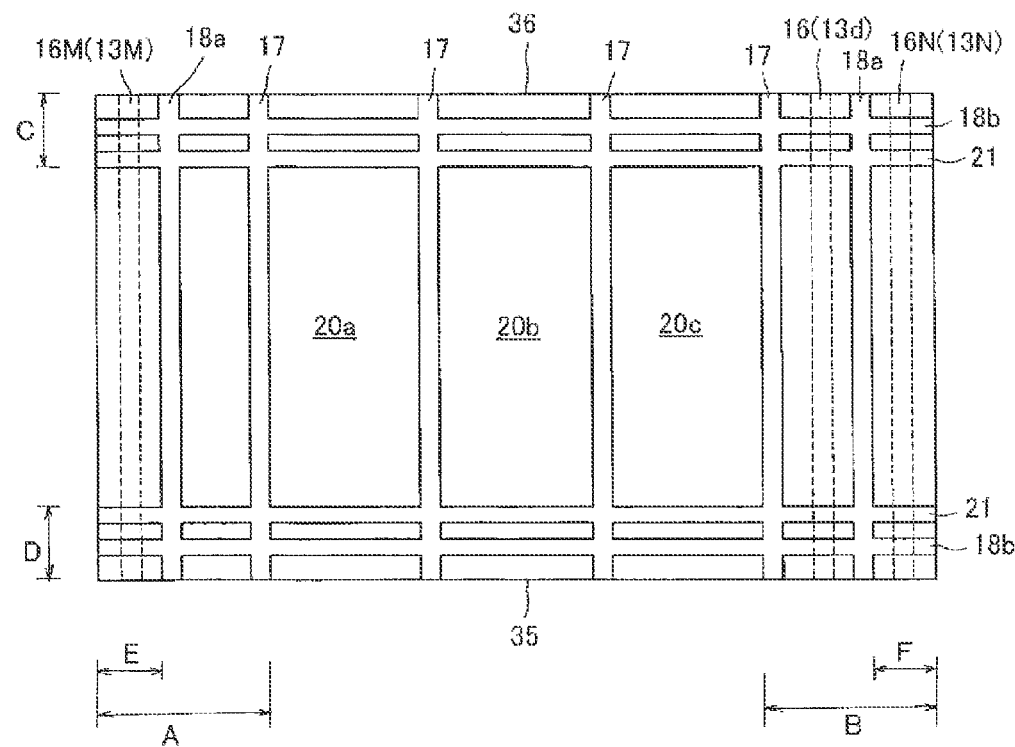
FIG. 8 is a plan view showing the organic EL device of the first embodiment of the present invention without a sealing member and a protection layer.
Figure 9:
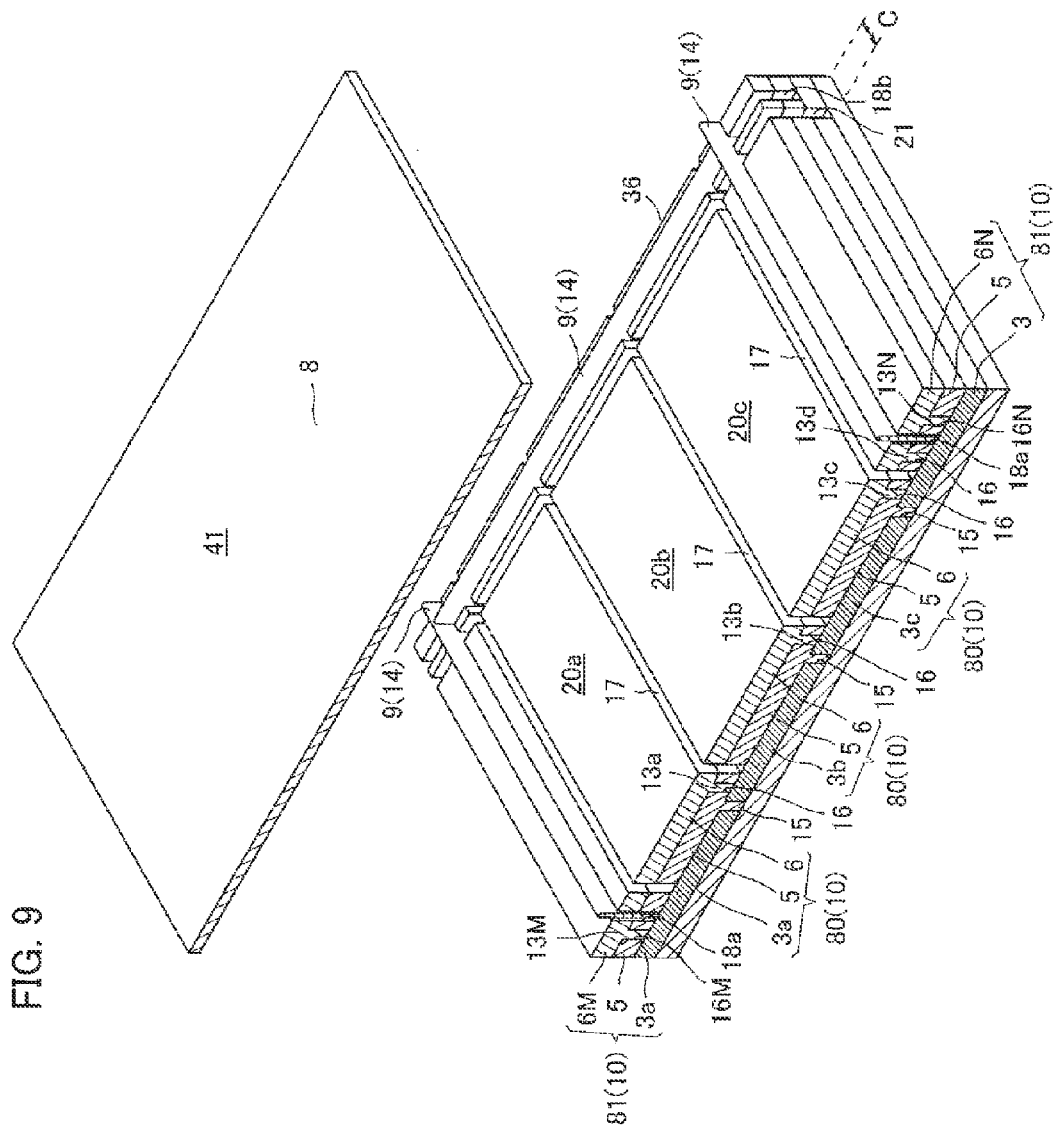
FIG. 9 is a cross-sectional perspective view of the organic EL device without the protection layer, the sealing member lying apart from the device.

In the short direction of the organic EL device 1, as shown in FIGS. 2, 8, and 9, the organic EL device 1 has non-emitting excluded regions C and D adjacent to both ends in the short direction of the substrate 2. The excluded regions C and D each have the first electrode layer 3 and the other layers. Therefore, a mask process to cover an undeposited surface that is not to be deposited is eliminated when the functional layer 5 and the other layers are deposited by a laser scribing process. The excluded regions C and D each have a separation groove (outer cross groove) 18b for fixing a frit, that is formed by removing at least any layer located above the first electrode layer 3. Hence, immediately after formation of the separation groove 18b for fixing a frit, the first electrode layer 3 is exposed at a bottom of the separation groove 18b. In this embodiment, the excluded regions C and D each have a separation groove (inner cross groove) 21 for preventing invasion, in which neither the first electrode layer 3 nor the other layers exist, formed parallel to sides 35 and 36 in the longitudinal direction of the substrate 2. In addition, in the separation groove 21 for preventing invasion a first electrode layer 3 does not exist.

In sum, in the organic EL device 1 of this embodiment, as shown in FIGS. 8 and 9, the separation grooves (inner cross grooves) 21 for preventing invasion, which are formed by removing the three layers consisting of the first electrode layer 3, the second electrode layer 6, and the functional layer 5, are formed parallel to the sides 35 and 36 in the longitudinal direction adjacent to the both ends of the organic EL element part 10. The separation grooves (inner cross grooves) 21 for preventing invasion each are a cross groove that extends from the excluded region A having a second electrode layer (first electrode communicating part) 6M to the excluded region B having a second electrode layer 6N (second electrode communicating part) and crosses the organic EL element part 10, which is a laminated body. The separation grooves 21 for preventing invasion are positioned interiorly of the separation grooves 18b for fixing a frit.

In this embodiment, as shown in FIGS. 2, 6, 7, and 9, the separation grooves 18a and 18b for fixing a frit extend in intersecting directions with each other. Specifically, the separation groove 18a for fixing a frit extends in a direction perpendicular to the separation groove 18b for fixing a frit. Adhesive parts 37, 38, 39, and 40 of the sealing member 8 are adhered to the separation grooves 18a and 18b for fixing a frit. The sealing member 8 is formed from an insulating material and has a main body 41 of a rectangular shape in a planar view. The insulating adhesive material 9 is thickly formed in each of the separation grooves 18a and 18b for fixing a frit, thereby defining a distance-keeping space 42 between the sealing member 8 and the organic EL element part 10. The distance-keeping space 42 is filled with inert gas such as nitrogen or argon. Further, it is preferable to put a desiccant for absorbing moisture and oxygen in the distance-keeping space 42. The adhesive parts 37 and 39 positioned along a longitudinal side of the sealing member 8 adhere respectively to the separation grooves 18a for fixing a frit that extend longitudinally in FIG. 8 via the insulating adhesive materials 9 as shown in FIG. 6. In contrast, the adhesive parts 38 and 40 positioned along a transverse side of the sealing member 8 adhere respectively to the separation grooves 18b for fixing a frit that extend transversely in FIG. 8 via the insulating adhesive materials 9 (connecting parts) as shown in FIG. 7.

Figure 10:
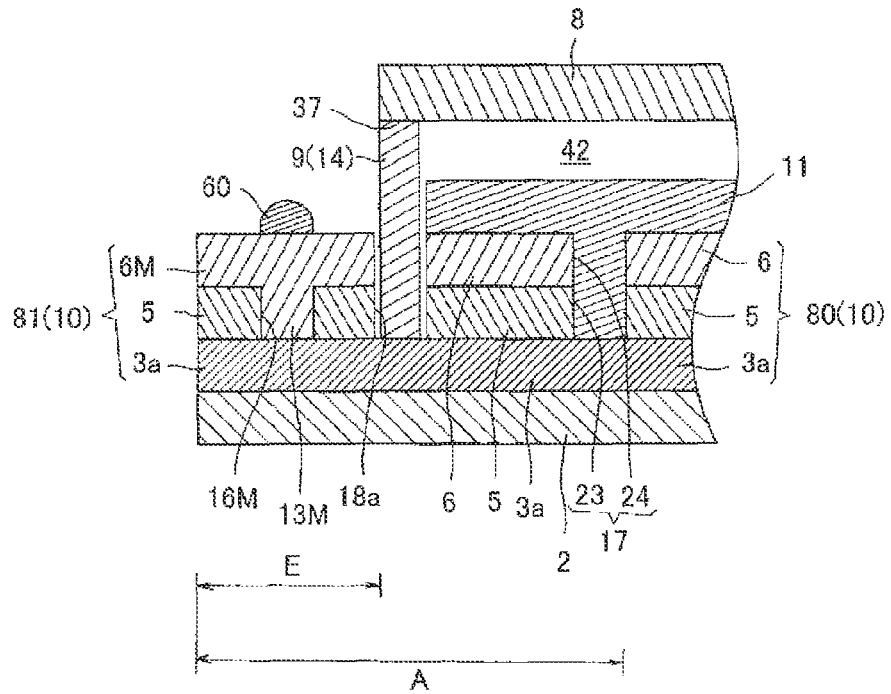
FIG. 10 is an enlarged view of an area M in FIG. 6.
Figure 11:
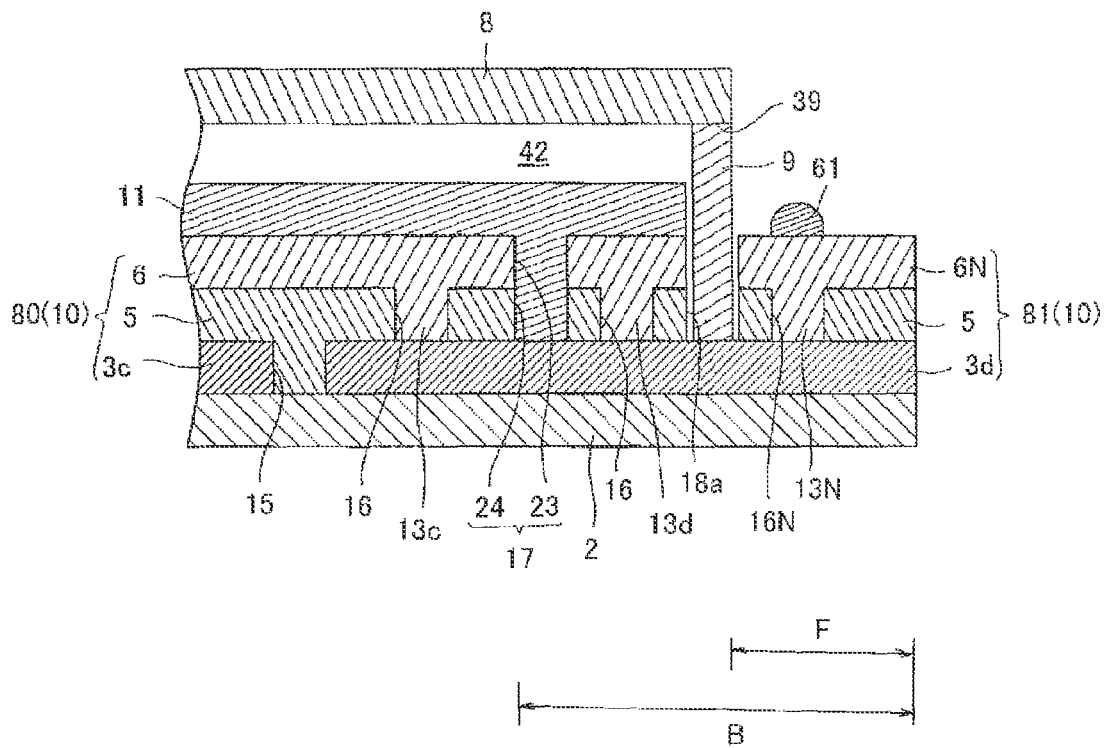
FIG. 11 is an enlarged view of an area N in FIG. 6.

In the organic EL device 1 of this embodiment, since the adhesive parts 37 and 39 positioned longitudinally along the sealing member 8 adhere respectively to the separation grooves 18a for fixing a frit as described above, the organic EL element part 10 is partly exposed outside of the sealing member 8 as shown in FIG. 1. Therefore, as described above, the organic EL device 1 has the non-emitting excluded regions A and B (non-emitting organic EL element areas 81) that are excluded from the emitting organic EL element area 80 and outer edges E and F of the excluded regions A and B are exposed outside of the sealing member 8 (FIG. 2). The outer edge E has a laminated configuration consisting of the organic EL element part 10 as shown in FIGS. 6 and 10, in which a first functional-layer separation groove 16M is formed at the outer side of the separation groove 18a for fixing a frit. In contrast, the outer edge F, which is located at an opposite side of the outer edge E, has a laminated configuration consisting of the organic EL element part 10 as shown in FIGS. 6 and 11, in which a first functional-layer separation groove 16N is formed at the outer side of the separation groove 18a for fixing a frit. The second electrode layer 6M that is located at the outer edge E is electrically connected to a first electrode layer 3a that is located in the emitting organic EL element area 80 (FIG. 10). On the other hand, a first electrode layer 3d that is located at the outer edge F is directly connected to the second electrode layer 6 that is located in the emitting organic EL element area 80 at the inner side of the sealing member 8 and is electrically connected to the second electrode layer 6N (second electrode communicating part) at the outer side of the sealing member 8 (FIG. 11). Thus, the second electrode layers 6M and 6N located at the exposed outer edges E and F are respectively energized via terminals 60 and 61 connected to a power source, so that an electric current is supplied to the organic EL element part 10, thereby making the emitting organic EL element area 80 in the organic EL element part 10 emit light.

This is the description of the characteristic configuration of the present embodiment. Now, a layer configuration of the organic EL element part 10 will be described below.

The organic EL element part 10 employed in this embodiment consists of integrated organic EL elements. Herein, the integrated organic EL elements are formed by strip-like organic EL elements (hereinafter each referred to as a "unit EL element") electrically connected in series.

The organic EL element part 10 has a basic layer configuration as shown in FIGS. 3 and 4, in which a plurality of grooves are formed so that the organic EL element part 10 of a planar shape is divided into strip-like unit EL elements 20a, 20b, 20c, and so on. The organic EL element part 10 consists of the first electrode layer 3, the functional layer 5, and the second electrode layer 6 sequentially laminated on the substrate 2. Herein, the functional layer 5 is a laminated layer containing a plurality of organic compound layers and is, for example, formed by a lamination consisting of a hole injection layer, a hole transport layer, an emission layer, an electron transport layer, and a conductive layer. As shown in FIG. 3, in the organic EL element part 10, first-electrode-layer separation grooves 15, first functional-layer separation grooves 16, second functional-layer separation grooves 23, and second-electrode-layer separation grooves 24 are formed in the respective layers.

Specifically, the first-electrode-layer separation grooves 15 are formed in the first electrode layer 3, so as to divide the first electrode layer 3 into more than one part. The first functional-layer separation grooves 16 are formed in the functional layer 5, so as to divide the functional layer 5 into more than one part. Further, a part of the second electrode layer 6 penetrates the first functional-layer separation grooves 16, so as to have contact with the first electrode layer 3 at a bottom of each groove. In other words, the first functional-layer separation grooves 16 each are an opening for conduction formed in the functional layer 5, in which opening a part of the second electrode layer 6 penetrates, so that the second electrode layer 6 makes contact with the first electrode layer 3 at the bottom of the groove. Still further, each of the second functional-layer separation grooves 23 formed in the functional layer 5 and each of the second-electrode-layer separation grooves 24 formed in the second electrode layer 6 communicate to each other, so as to form a deep common groove, which is a unit-EL-element separation groove 17, as a whole. Thus, the unit-EL-element separation groove 17 has a depth at least reaching the second electrode layer 6 and preferably reaching the functional layer 5.

Referring to FIG. 4, the organic EL device 1 has the unit EL elements 20a, 20b, 20c, and so on formed independently by dividing the respective thin layers by the first-electrode-layer separation grooves 15 formed in the first electrode layer 3 and the unit-EL-element separation grooves 17 formed in the functional layer 5 and the second electrode layer 6. In other words, the unit EL element 20 is constituted by one of a plurality of parts of the first electrode layer 3 divided by the first-electrode-layer separation grooves 15, and the functional layer 5 and the second electrode layer 6 that are laminated on the divided first electrode layer 3, as shown in FIG. 3.

Further, as shown in FIGS. 3, 4, and 5, a part of the second electrode layer 6 penetrates the first functional-layer separation groove 16 and is brought into contact with a first electrode layer 3b, so that the unit EL element 20a is electrically connected to the adjacent unit EL element 20b in series. Since the first-electrode-layer separation groove 15 and the first functional-layer separation groove 16 are located at different positions, the functional layer 5 and the second electrode layer 6 that are positioned in the unit EL element 20a are excluded from the first electrode layer 3a and bridge over the adjacent unit EL element 20b. The second electrode layer 6 has a penetration part 13a that penetrates the first functional-layer separation groove 16, which is brought into contact with the first electrode layer 3b in the adjacent unit EL element 20b. As a consequence, the unit EL element 20a on the substrate 2 is serially connected to the unit EL element 20b via the penetration part 13a of the second electrode layer 6.

Further, as shown in FIGS. 6 and 10, the terminal 60 connected to an external power source is connected to the second electrode layer 6M located at the outer edge E at the excluded region A (non-emitting organic EL element area 81). In contrast, as shown in FIGS. 6 and 11, the terminal 61 connected to an external power source is connected to the second electrode layer 6N located at the outer edge F at the excluded region B (non-emitting organic EL element area 81). Referring to FIGS. 6 and 10, a part of the second electrode layer 6M penetrates the first functional-layer separation groove 16M at the outer edge E and is brought into contact with the first electrode layer 3a, so that the second electrode layer 6M is electrically connected to the adjacent unit EL element 20a in series. In other words, due to existence of the first functional-layer separation groove 16M, a penetration part 13M of the second electrode layer 6M located at the outer edge E and penetrating the first functional-layer separation groove 16M is brought into contact with the first electrode layer 3a. As a consequence, the terminal 60 connected to the external power source is connected to the second electrode layer 6M, so that the penetration part 13M of the second electrode layer 6M is serially connected to the unit EL element 20a via the first electrode layer 3a.

In contrast, as shown in FIGS. 6 and 11, a part of the second electrode layer 6N located at the outer edge F penetrates the first functional-layer separation groove 16N, so that the first electrode layer 3d is connected to a part of the second electrode layer 6N (second electrode communicating part). As a consequence, the first electrode layer 3d extending from the emitting organic EL element area 80 is serially connected to the terminal 61 via the penetration part 13N of the second electrode layer 6N located at the outer edge F.

Figure 12:
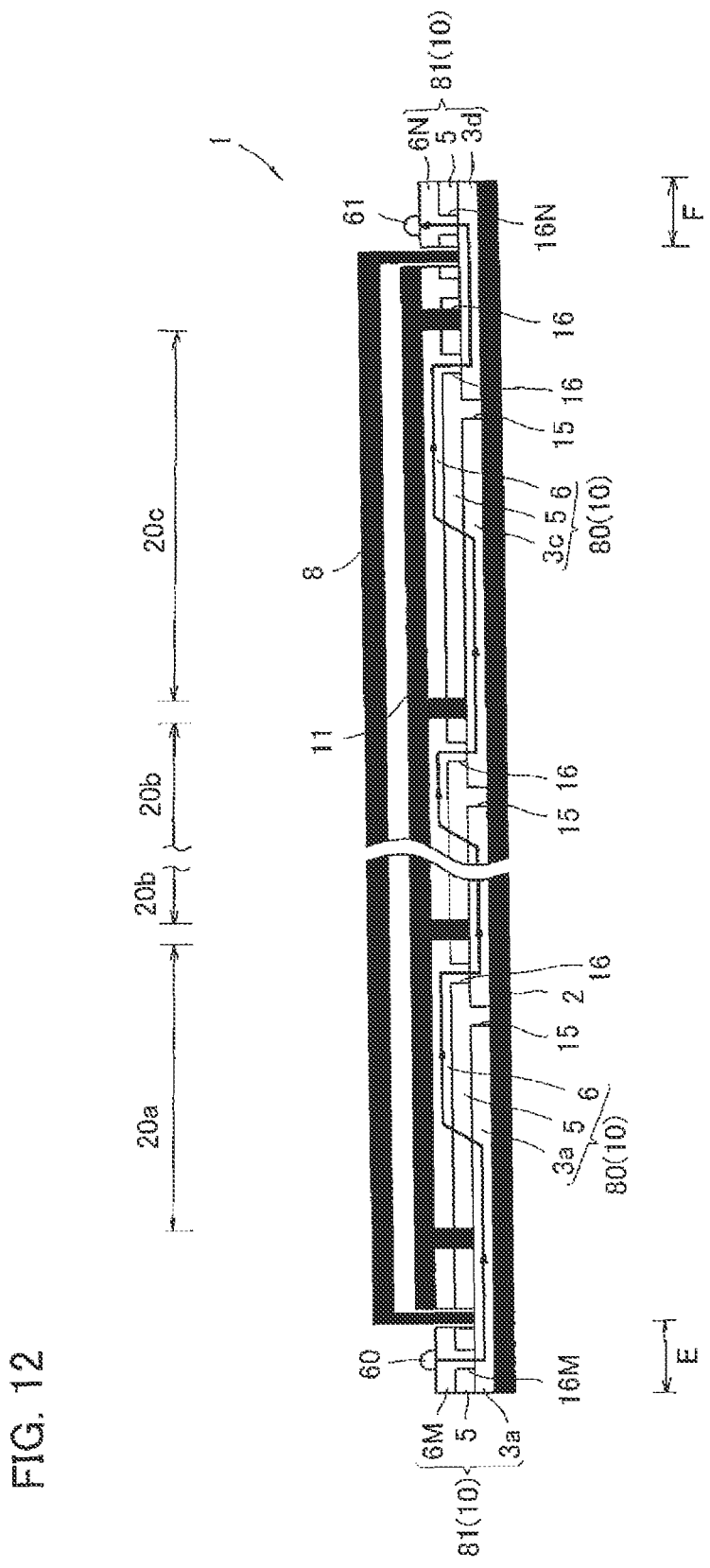
FIG. 12 is an explanatory view showing a current pathway when an electric current is supplied from a power source based on the cross section in FIG. 6, in which view insulating members are colored in black and not hatched for simplification.

An actual current flow will be described below with reference to FIG. 12. FIG. 12 shows an actual flow of an electric current by arrows. An electric current supplied from an external power source flows from the terminal 60 connected to the external power source through the second electrode layer 6M located at the outer edge E to the first electrode layer 3a in the emitting organic EL element area 80. Since a part of the second electrode layer 6M makes contact with the adjacent first electrode layer 3a via the penetration part 13M in the first functional-layer separation groove 16M, the electric current flows to the first electrode layer 3a in the emitting organic EL element area 80 through the penetration part 13M.

Further, in the emitting organic EL element area 80, the electric current flows from the first electrode layer 3a through the functional layer 5 to the second electrode layer 6. At this time, since a part of the second electrode layer 6 makes contact with the adjacent first electrode layer 3b via the penetration part 13a in the first functional-layer separation groove 16, the electric current flows through the unit EL element 20a to the first electrode layer 3b of the adjacent unit EL element 20b. Subsequently, the electric current flows through the unit EL elements 20 similarly to above and reaches the first electrode layer 3d. Then, the electric current flows from the first electrode layer 3d, which extends from the emitting organic EL element area 80, through the penetration part 13N, which is located at the outer edge F, to the second electrode layer 6N and reaches the terminal 61 connected to the external power source. In this way, in the integrated organic EL element part 10, all the unit EL elements 20 are electrically connected in series, so as to emit light.

This is the description of the layer configuration of the organic EL element part 10. Now, a method for producing the organic EL device 1 relating to the present embodiment will be described below. The organic EL device 1 is produced using a vacuum deposition device not shown and a laser scribing machine not shown.

As a first step concerning the organic EL device 1, a step (first-electrode-layer laminating step) of laminating the first electrode layer 3 on the substrate 2 is performed (FIG. 13A to FIG. 13B).

The first electrode layer 3 is deposited by a method such as a sputtering method and a CVD method. The first electrode layer 3 is preferably indium tin oxide (ITO) deposited by a sputtering method or an ion plating method or zinc oxide deposited by a low-pressure thermal CVD especially among CVD methods.

The first electrode layer 3 preferably has an average thickness of 30 μm to 500 μm.

Subsequently, a first laser scribing step is performed, thereby forming the first-electrode-layer separation grooves 15 in the first electrode layer 3 (FIG. 13B to FIG. 13C). At this time, the first-electrode-layer separation grooves 15 are formed in a longitudinal direction in the figure and parallel to one another.

Herein, the laser scribing machine should have an X-Y table, a laser generator, and an optical member. The first laser scribing step is performed in such a manner that the substrate 2 is placed on the X-Y table and is moved linearly in a longitudinal direction at a constant speed and irradiated by a laser beam. Then, the X-Y table is moved transversely so that an irradiated location of the laser beam is shifted. The substrate 2 is moved linearly in the longitudinal direction again and irradiated by the laser beam.

For some cases, a surface of the substrate is washed in order to remove a fly film from the substrate having been subjected to the first laser scribing.

Figure 16:
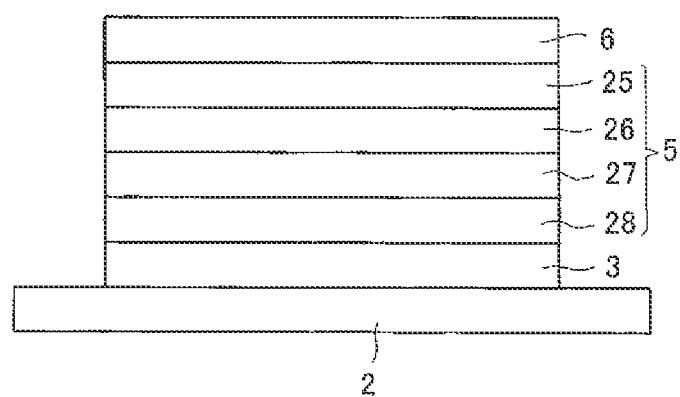
FIG. 16 is a cross section showing a layer configuration of the organic EL element part of the first embodiment of the present invention.

Next, the functional layer 5 is formed on an entire area of the resulting substrate by sequentially depositing the hole injection layer, 28, the hole transport layer 27, the emission layer 26, the electron transport layer 25, and the like on the resulting substrate by vacuum deposition (functional-layer laminating step) (FIG. 13C to FIG. 13D and FIG. 16).

Then, a second laser scribing step is performed on the resulting substrate, thereby forming the first functional-layer separation grooves 16 in the functional layer 5 (FIG. 13D to FIG. 13E).

At this time, the first functional-layer separation grooves 16 are formed in a longitudinal direction in the figure and parallel to one another. Additionally, the first functional-layer separation grooves 16 are shifted by predetermined intervals relative to the first-electrode-layer separation grooves 15.

Subsequently, the resulting substrate is introduced into the vacuum deposition device, so that the second electrode layer 6 is formed on an entire area of the functional layer 5 (second-electrode-layer laminating step) (FIG. 13E to FIG. 13F).

Figure 14:
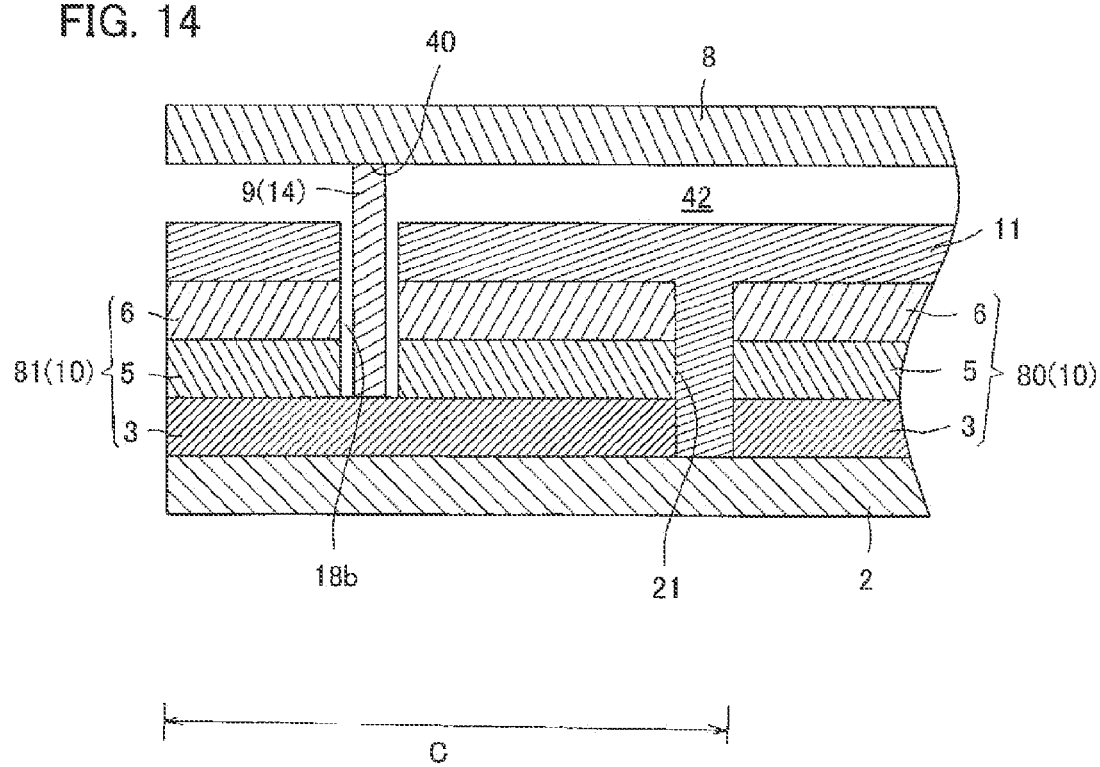
FIG. 14 is an enlarged view of an area T in FIG. 7.

Subsequently, a third laser scribing step is performed, thereby forming the unit-EL-element separation grooves 17 bridging over the functional layer 5 and the second electrode layer 6. Further, around this step, the separation grooves 21 for preventing invasion (inner cross grooves) are formed through the three layers of the first electrode layer 3, the functional layer 5, and the second electrode layer 6 (FIG. 13F to FIG. 13G). Herein, the unit-EL-element separation grooves 17 are formed in a longitudinal direction in the figure and parallel to one another. Additionally, the separation grooves 21 for preventing invasion are formed in a direction perpendicular to the unit-EL-element separation grooves 17 (in a transverse direction in the figure). The separation grooves 21 for preventing invasion are, as shown in FIGS. 7 and 14, formed through the three layers of the first electrode layer 3, the functional layer 5, and the second electrode layer 6. The separation grooves 21 for preventing invasion prevent a substance such as moisture from invading into the functional layer 5. Specifically, the insulating adhesive material 9 may be deteriorated after a long time operation of the organic EL device 1, which may allow the invasion of moisture into the organic EL element part 10. In a case where the invading moisture might penetrate an interfacial surface of each layer of the organic EL element part 10, the separation grooves 21 for preventing invasion prevent moisture from invading into a power generation part, being formed through the three layers of the first electrode layer 3, the functional layer 5, and the second electrode layer 6.

Subsequently, the protection layer 11 is formed on the second electrode layer 6 (protector laminating step) (FIG. 13G to FIG. 13H). The protection layer 11 can be formed on an entire area of the resulting layer, but preferably is not formed at the right and the left sides in the figure for extracting electrodes.

Further subsequently, a fourth laser scribing step is performed, thereby forming the separation grooves 18a and 18b for fixing a frit, which is formed by removing at least layers consisting of the functional layer 5 and any layer above the functional layer 5, in the non-emitting regions (FIG. 13H to FIG. 13I). While the separation grooves 18a for fixing a frit are formed in a longitudinal direction, the separation grooves 18b for fixing a frit are formed in a transverse direction. The separation grooves for fixing a frit 18a and 18a are parallel to each other, and the separation grooves for fixing a frit 18b and 18b are parallel to each other.

Figure 15:
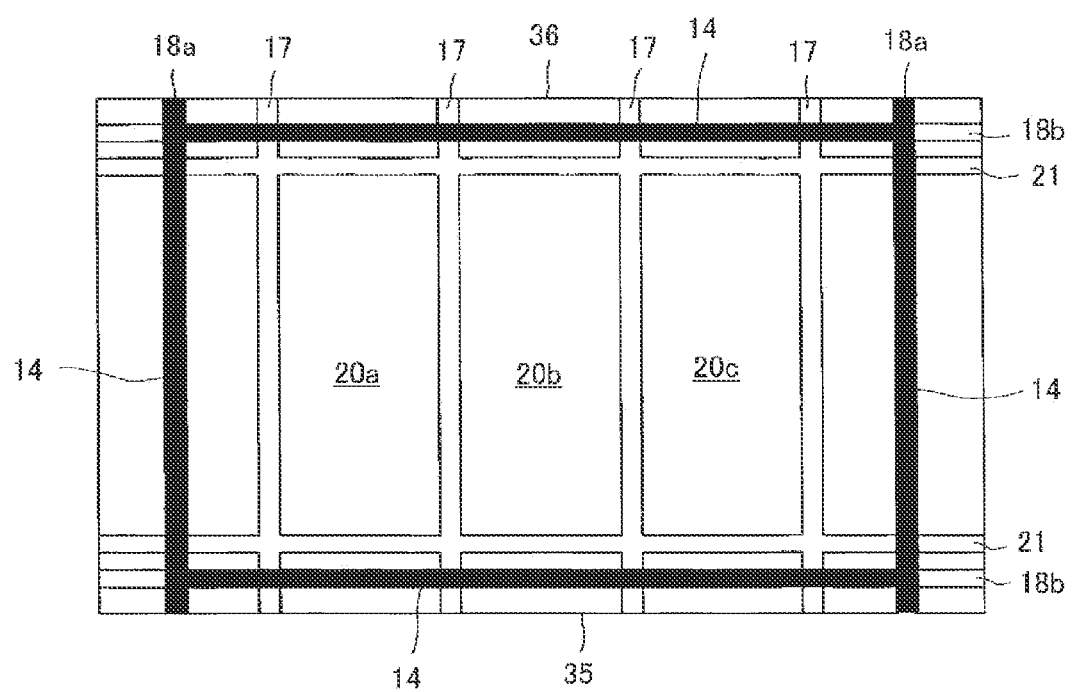
FIG. 15 is a front view of the plan view of FIG. 8 with an area where an insulating adhesive is arranged being colored in black.

Then, insulating fritted glasses 14 are disposed at the separation grooves 18a and 18b for fixing a frit. Specifically the insulating fritted glasses 14 are disposed at portions colored in black in FIG. 15.

The insulating fritted glasses 14 are sequentially irradiated by a laser beam, so as to be melted. Specifically, the fritted glasses 14 within the separation grooves 18a and 18b for fixing a frit are melted by partly heating the fritted glasses 14, thereby attaching the first electrode layer 3 to the sealing member 8. The sealing is performed by the attachment of the sealing member 8 in this way (sealing step), and the organic EL device is completed (FIG. 13I to FIG. 13J).

This configuration prevents a substance such as moisture from invading into the emitting portion of the organic EL device.

The sealing member 8 is of a plate-like shape in the above-mentioned embodiment, but the shape of the sealing member 8 is not particularly limited. In a case where the sealing member 8 is of a lid-like shape, the insulating adhesive material 9 can be thinner and inhibits the invasion of moisture resulting from deterioration of the insulating adhesive material 9.

In the above-mentioned embodiment, the distance-keeping space 42 is filled with inert gas, but the present invention is not limited thereto and may fill the distance-keeping space 42 with a mixture of resin and desiccant or deoxidant for absorbing moisture and/or oxygen.

Finally, a material of each component of the organic EL device 1 will be described below.

The material of the substrate 2 (base material) is not particularly limited and employs a transparent substrate. The material is appropriately selected from a flexible film substrate or plastic substrate or the like. A glass substrate and a film substrate are particularly preferable in view of transparency and workability.

The material of the above-mentioned film substrate includes thermoplastic resin or thermohardening resin. The thermoplastic resin includes acrylate resin, polyester, polycarbonate resin, polyolefin, and cycroolefin polymer. The thermohardening resin includes polyurethane. Particularly, it is preferable to use a substrate containing cycloolefin polymer (COP) having both an excellent optical isotropy and excellent moisture barrier properties as a major ingredient.

The COP includes norbornene polymer, olefin norbornene copolymer, and polymer of unsaturated alicyclic hydrocarbon polymer such as cyclopentadiene. In view of moisture barrier properties, it is preferable not to include a functional group that indicates a large polarity in main chain and side chain of a constituent element, such as a carbonyl group and a hydroxyl group.

The above-mentioned film substrate preferably has a thickness of 0.03 mm to 3.0 mm around. This range of film thickness is preferable in view of a strength to bending of a substrate and scratch to a substrate in addition to an easy handling of a substrate and a weight in the production of a device. Furthermore, in view of great heat resistance, a material such as polyethylene naphthalate (PEN) and polyether sulfone (PES) can be selected.

The material of the first electrode layer 3 is not particularly limited and may comprise, for example, a metal oxide such as indium tin oxide (ITO), indium zinc oxide (IZO), stannic oxide ($SnO_2$), and zinc oxide (ZnO), a metal such as silver (Ag) and chromium (Cr), or the like. In view of efficient extraction of light emitted from the emission layer in the functional layer 5, highly transparent ITO or IZO can be particularly preferably selected.

The functional layer 5 has, as shown in FIG. 16, a configuration in which the electron transport layer 25, the emission layer 26, the hole transport layer 27, and the hole injection layer 28 are laminated in this order from a side of the second electrode layer 6.

The material of the electron transport layer 25 may comprise a known material, such as 2-(4-biphenylyl)-5-(4-tert-butyl-phenyl)-1,3,4-oxadiazole, 2,5-bis(1-naphthyl)-1,3,4-oxadiazole, oxadiazole derivative, bis(10-hydroxybenzo[h] quinolinolato) beryllium complex, or triazole compound, but the present invention is not limited thereto.

The material of the emission layer 26 may comprise a known material, such as 9,10-diaryl anthracene derivative, pyrene, coronene, perylene, rubrene, 1,1,4,4-tetraphenyl butadiene, tris(8-quinolinolato)aluminum complex, tris(4-methyl-8-quinolinolato)aluminum complex, bis(8-quinolinolato) zinc complex, tris(4-methyl-5-trifluoromethyl-8-quinolinolato)aluminum complex, tris(4-methyl-5-cyano-8-quinolinolato)aluminum complex, bis(2-methyl-5-trifluoromethyl-8-quinolinolato)[4-(4-cyanophenyl) phenolate]aluminum complex, bis(2-methyl-5-cyano-8-quinolinolato) [4-(4-cyanophenyl)phenolate]aluminum complex, tris(8-quinolinolato) scandium complex, bis[8-(para-tosyl)aminoquinoline]zinc complex, bis[8-(para-tosyl) aminoquinoline]cadmium complex, 1,2,3,4-tetraphenylcyclopentadiene, pentaphenyl cyclopentadiene, poly-2,5-diheptyloxy-para-phenylenevinylene, coumarin phosphor, perylene phosphor, pyran phosphor, anthrone phosphor, porphyrin phosphor, quinacridone phosphor, N,N'-dialkyl substituted quinacridone phosphor, naphthalimide phosphor, N'-dialyl substituted pyrrolopyrrole phosphor, a low-molecular luminescence material like a phosphorescent luminous body such as Ir complex, a high-polymer material like polyfluorene, polyparaphenylene vinylene, polythiophene, or polyspiro compounds, and a material for dispersing or copolymerizing a low-molecular material on or with these high-polymer materials. But the present invention is not limited thereto.

The material of the hole transport layer 27 may select a known material, such as metal phthalocyanine like copper phthalocyanine or tetra(t-butyl) copper phthalocyanine, non-metal phthalocyanine, quinacridone compound, an aromatic amine low-molecular hole injection transport material like 1,1-bis(4-di-p-tolylaminophenyl)cyclohexane, N,N'-diphenyl-N,N'-bis(3-methylphenyl)-1,1'-biphenyl-4,4'-diamine, or N,N'-di(1-naphthyl)-N,N'-diphenyl-1,1'-biphenyl-4,4'-diamine, a high-polymer hole transport layer material like polyaniline, polythiophene, polyvinyl carbazole, or a mixture of poly(3,4-ethylenedioxythiophene) and polystyrene sulfonate, and a polythiophene oligomer material. But the present invention is not limited thereto.

The material of the hole injection layer 28 may select a known material, such as 1,3,5-tricarbazolyl benzene, 4,4'-biscarbazolylbiphenyl, polyvinylcarbazole, m-biscarbazolylphenyl, 4,4'-biscarbazolyl-2,2'-dimethylbiphenyl, 4,4', 4''-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4, 4'-diamine (TPD), N,N'-di(naphtalene-1-yl)-N,N'-diphenyl benzidine (α-NPD), N,N'-diphenyl-N,N'-bis(1-naphthyl)-(1, 1'-biphenyl)-4,4'-diamine (NPB), poly(9,9-dioctylfluorene-co-N-(4-butylphenyl)diphenylamine) (TFB), and poly(9,9-dioctylfluorene-co-bis-N,N-phenyl-1,4-phenylenediamine) (PFB). But the present invention is not limited thereto.

These constituting layers of the functional layer 5 may be deposited by an appropriate known method such as a vacuum deposition method, a sputtering method, a CVD method, a dipping method, a roll coating method (printing method), a spin coating method, a bar coating method, a spraying method, a dye coating method, and a flow coating method.

Concerning the second electrode layer 6, the material of the second electrode layer 6 may select a known material, such as silver or aluminum. These materials are preferably deposited by a sputtering method or a vacuum deposition method.

The material of the protection layer 11 may select a known material, such as a metal oxide like silicon oxide, aluminum oxide, chromium oxide, or magnesium oxide, a metal fluoride like aluminum fluoride, magnesium fluoride, or calcium fluoride, a metal nitride like silicon nitride, aluminum nitride, or chromium nitride, a metal oxynitride like silicon oxynitride, an inorganic material like DLC (diamond like carbon) or amorphous silicon film, and a resin material like polyester such as polyethylene terephthalate (PET) and polyethylene naphthalate (PEN), polyethylene, polypropylene, cellophane, cellulose esters such as cellulose diacetate, cellulose triacetate, cellulose acetate butyrate, cellulose acetate propionate (CAP), cellulose acetate phthalate, and cellulose nitrate or their derivatives, polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyether ketone imide, polyamide, fluororesin, nylon, polymethyl methacrylate, acrylic, polyarylates, and cycloolefin resin.

The protection layer 11 is preferably made of a material having a gas barrier property and/or a moisture-absorption characteristic. Herein, the term "gas barrier property" means a property preventing air such as oxygen and nitrogen from invading. The protection layer 11 preferably has an oxygen gas barrier property.

The film formation method of the protection layer 11 may select a deposition method such as a resistance heating deposition method, an electron beam deposition method, a reactive deposition method, an ion plating method, a sputtering method, and a CVD method depending on the material.

The material of the sealing member 8 may select a known material, such as polyester like polyethylene terephthalate (PET) or polyethylene naphthalate (PEN), polyethylene, polypropylene, cellophane, cellulose esters like cellulose diacetate, cellulose triacetate, cellulose acetate butyrate, cellulose acetate propionate (CAP), cellulose acetate phthalate (TAC), or cellulose nitrate or their derivatives, polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyether ketone imide, polyamide, fluororesin, nylon, polymethyl methacrylate, acrylic, polyarylates, cycloolefin resin, a metal foil like aluminum or stainless steel, and a laminated film of a metal film like aluminum, copper, nickel, or stainless steel on a resin film. But the present invention is not limited thereto.

DESCRIPTION OF REFERENCE CHARACTERS 1. organic EL device
2. substrate (base material)
3. first electrode layer
5. functional layer (organic emitting layer)
6. second electrode layer
6M. second electrode layer (first electrode communicating part)
6N. second electrode layer (second electrode communicating part)
8. sealing member
9. insulating adhesive material (connecting part)
10. organic EL element part (laminated body)
14. insulating fritted glass (adhesive material)
16M, 16N. first functional-layer separation groove (opening for conduction)
18b. separation groove for fixing a frit (outer cross groove, second cross groove)
20. unit EL element
21. separation groove for preventing invasion (inner cross groove, first cross groove)

The invention claimed is:
1. An organic EL device comprising a laminated body consisting of a first electrode layer, an organic emitting layer, and a second electrode layer laminated on a substrate and a sealing member sealing the laminated body,
the substrate having one side and another side opposite to the one side, a direction connecting the one side and another side of the substrate being set as a first direction as viewed in a plan view,
the organic EL device having a first electrode communicating part electrically connected to the first electrode layer at the one side of the substrate and a second electrode communicating part electrically connected to the second electrode layer at the other side of the substrate, so that a conductive pathway is formed within the laminated body to conduct electrical current between the first electrode communicating part and the second electrode communicating part,
the organic EL device having a first cross groove crossing the laminated body and extending from the first electrode communicating part to the second electrode communicating part,
wherein the first cross groove is formed by removing all of the first electrode layer, the organic emitting layer, and the second electrode layer, and
wherein the sealing member and the substrate are connected by a connecting part,
wherein the connecting part and the first cross groove are arranged in a second direction that is substantially perpendicular to the first direction in the plan view, so that the connecting part is arranged closer to a terminal end of the second direction than the first cross groove.

2. The organic EL device according to claim 1,
having a second cross groove arranged in the second direction so that the second cross groove is arranged closer to a terminal end of the second direction than the first cross groove,
wherein the second cross groove is formed by removing at least the organic emitting layer and the second electrode layer, and
wherein the sealing member is attached to the second cross groove via an adhesive material disposed in the second cross groove.

3. The organic EL device according to claim 2,
having a first longitudinal groove formed in a direction perpendicular to the second cross groove,
wherein the first longitudinal groove is formed by removing at least the organic emitting layer and the second electrode layer,
wherein, in the first longitudinal groove, at least the first electrode layer is laminated, and
wherein the sealing member is attached to the first longitudinal groove via an adhesive material disposed in the first longitudinal groove.

4. The organic EL device according to claim 3,
wherein the first longitudinal groove and the second cross groove are formed by a laser scribing process,
the first longitudinal groove having at least a part of a bottom face composed of a same layer configuration as that of the second cross groove.

5. The organic EL device according to claim 1,
wherein the first electrode layer, the organic emitting layer, and the second electrode layer have grooves so as to be divided into a plurality of unit EL elements,
the unit EL elements being electrically connected in series.

6. The organic EL device according to claim 1,
wherein the first electrode layer extends outwardly from the sealing member, and
the first electrode layer being directly connected to the second electrode layer within the sealing member and being electrically connected to the second electrode communicating part in series outside of the sealing member.

7. The organic EL device according to claim 1, wherein the sealing member is formed by an insulating material.

8. The organic EL device according to claim 1, wherein the sealing member is attached to the laminated body via an insulating adhesive material.

9. The organic EL device according to claim 8, the insulating adhesive material containing a fitted glass as a major ingredient.

10. The organic EL device according to claim 1, wherein the first cross groove is formed by a laser scribing process.

11. The organic EL device according to claim 1, the first cross groove having at least a part of a bottom face, on which a protection layer having a gas barrier property and/or a moisture absorption characteristic is laminated.

12. An organic EL device comprising a laminated body consisting of a first electrode layer, an organic emitting layer, and a second electrode layer laminated on a substrate and a sealing member sealing the laminated body,
the substrate having one side and another side opposite to the one side, a direction connecting the one side and another side of the substrate being set as a first direction as viewed in a plan view,
the organic EL device having a first electrode communicating part electrically connected to the first electrode layer at the one side of the substrate and a second electrode communicating part electrically connected to the second electrode layer at the other side of the substrate, so that a conductive pathway is formed within the laminated body to conduct electrical current between the first electrode communicating part and the second electrode communicating part,
the organic EL device having a first cross groove crossing the laminated body and extending from the first electrode communicating part to the second electrode communicating part,
wherein the first cross groove is formed by removing all of the first electrode layer, the organic emitting layer, and the second electrode layer,
wherein the sealing member and the substrate are connected by a connecting part,
wherein the connecting part and the first cross groove are arranged in a second direction that is substantially perpendicular to the first direction in the plan view, so that the connecting part is arranged closer to a terminal end of the second direction than the first cross groove,
the organic EL device having a second cross groove arranged in the second direction so that the second cross groove is arranged closer to a terminal end of the second direction than the first cross groove,
wherein the second cross groove is formed by removing at least the organic emitting layer and the second electrode layer,
wherein the sealing member is attached to the second cross groove via an adhesive material disposed in the second cross groove, and
wherein the sealing member is attached to the second cross groove via an insulating adhesive material containing a fritted glass as a major ingredient.

13. An organic EL device comprising a laminated body consisting of a first electrode layer, an organic emitting layer, and a second electrode layer laminated on a substrate and a sealing member sealing the laminated body,
the substrate having one side and another side opposite to the one side, a direction connecting the one side and another side of the substrate being set as a first direction as viewed in a plan view,
the organic EL device having a first electrode communicating part electrically connected to the first electrode layer at the one side of the substrate and a second electrode communicating part electrically connected to the second electrode layer at the other side of the substrate, so that a conductive pathway is formed within the laminated body to conduct electrical current between the first electrode communicating part and the second electrode communicating part,
the organic EL device having a first cross groove crossing the laminated body and extending from the first electrode communicating part to the second electrode communicating part,
wherein the first cross groove is formed by removing all of the first electrode layer, the organic emitting layer, and the second electrode layer,
wherein the sealing member and the substrate are connected by a connecting part,
wherein the connecting part and the first cross groove are arranged in a second direction that is substantially perpendicular to the first direction in the plan view, so that the connecting part is arranged closer to a terminal end of the second direction than the first cross groove,
the organic EL device having a second cross groove arranged in the second direction so that the second cross groove is arranged closer to a terminal end of the second direction than the first cross groove,
wherein the second cross groove is formed by removing at least the organic emitting layer and the second electrode layer,
wherein the sealing member is attached to the second cross groove via an adhesive material disposed in the second cross groove,
the organic EL device having a first longitudinal groove formed in a direction perpendicular to the second cross groove,
wherein the first longitudinal groove is formed by removing at least the organic emitting layer and the second electrode layer,
wherein, in the first longitudinal groove, at least the first electrode layer is laminated,
wherein the sealing member is attached to the first longitudinal groove via an adhesive material disposed in the first longitudinal groove,
wherein the first longitudinal groove and the second cross groove are formed by a laser scribing process,
the first longitudinal groove having at least a part of a bottom face composed of a same layer configuration as that of the second cross groove,
wherein the first electrode layer, the organic emitting layer, and the second electrode layer have grooves so as to be divided into a plurality of unit EL elements,
the unit EL elements being electrically connected in series,
wherein the first cross groove is formed by a laser scribing process, the organic EL device having a non-emitting organic EL element area arranged in the second direction so that the non-emitting organic EL element area is arranged closer to a terminal end of the second direction than the first cross groove,
wherein, in the non-emitting organic EL element area, the first electrode layer, the organic emitting layer, and the second electrode layer are laminated, and the first cross groove having at least a part of a bottom face, on which a protection layer having a gas barrier property and/or a moisture absorption characteristic is laminated.

14. An organic EL device comprising a laminated body consisting of a first electrode layer, an organic emitting layer, and a second electrode layer laminated on a substrate and a sealing member sealing the laminated body,
- the substrate having one side and another side opposite to the one side,
- the organic EL device having a first electrode communicating part electrically connected to the first electrode layer at the one side of the substrate and a second electrode communicating part electrically connected to the second electrode layer at the other side of the substrate,
- the organic EL device having a first cross groove crossing the laminated body from the first electrode communicating part to the second electrode communicating part,
- wherein the first cross groove is formed by removing all of the first electrode layer, the organic emitting layer, and the second electrode layer,
- wherein the sealing member and the substrate are connected at a connecting part located outside of the first cross groove,
- the organic EL device having a second cross groove located outside of the first cross groove,
- wherein the second cross groove is formed by removing at least the organic emitting layer and the second electrode layer,
- wherein the sealing member is attached to the second cross groove via an adhesive material disposed in the second cross groove,
- the organic EL device having a first longitudinal groove formed in a direction perpendicular to the second cross groove,
- wherein the first longitudinal groove is formed by removing at least the organic emitting layer and the second electrode layer,
- wherein, in the first longitudinal groove, at least the first electrode layer is laminated,
- wherein the sealing member is attached to the first longitudinal groove via an adhesive material disposed in the first longitudinal groove,
- wherein the first longitudinal groove and the second cross groove are formed by a laser scribing process,
- the first longitudinal groove having at least a part of a bottom face composed of a same layer configuration as that of the second cross groove,
- wherein the first electrode layer, the organic emitting layer, and the second electrode layer have grooves so as to be divided into a plurality of unit EL elements,
- the unit EL elements being electrically connected in series,
- wherein the first electrode layer extends outwardly from the sealing member,
- the first electrode layer being directly connected to the second electrode layer within the sealing member and being electrically connected to the second electrode communicating part in series outside of the sealing member,
- wherein the sealing member is formed by an insulating material,
- wherein the sealing member is attached to the second cross groove via an insulating adhesive material containing a fritted glass as a major ingredient,
- wherein the first cross groove is formed by a laser scribing process,
- the organic EL device having a non-emitting organic EL element area located outside of the first cross groove,
- wherein, in the non-emitting organic EL element area, the first electrode layer, the organic emitting layer, and the second electrode layer are laminated, and
- the first cross groove having at least a part of a bottom face, on which a protection layer having a gas barrier property and/or a moisture absorption characteristic is laminated.

* * * * *